(12) United States Patent
Lin et al.

(10) Patent No.: US 10,784,854 B1
(45) Date of Patent: Sep. 22, 2020

(54) POWER CONTROL DEVICE

(71) Applicant: INNO-TECH CO., LTD., Taipei (TW)

(72) Inventors: Chih-Feng Lin, Taipei (TW); Shu-Chia Lin, Taipei (TW); Tsu-Huai Chan, Taipei (TW)

(73) Assignee: INNO-TECH CO., LTD., Taipei (TW)

( * ) Notice: Subject to any disclaimer, the term of this patent is extended or adjusted under 35 U.S.C. 154(b) by 0 days.

(21) Appl. No.: 16/568,914

(22) Filed: Sep. 12, 2019

(51) Int. Cl.
*H03K 17/16* (2006.01)
(52) U.S. Cl.
CPC ........... *H03K 17/162* (2013.01); *H03K 17/16* (2013.01)
(58) Field of Classification Search
CPC .............................. H03K 17/162; H03K 17/16
USPC .... 327/108–112, 427, 434, 437; 326/82, 83, 326/87
See application file for complete search history.

(56) References Cited

U.S. PATENT DOCUMENTS 9,331,585 B1 * 5/2016 Lin ................... H02M 3/33507

FOREIGN PATENT DOCUMENTS

| CN | 103095137 B | 8/2016 |
|---|---|---|
| TW | I250406 B | 3/2006 |
| TW | I399912 B | 6/2013 |
| TW | I473396 B | 2/2015 |
| TW | I563788 B | 12/2016 |

* cited by examiner

*Primary Examiner* — Tomi Skibinski
(74) *Attorney, Agent, or Firm* — Lin & Associates Intellectual Property, Inc.

(57) ABSTRACT

Disclosed is a power control device suitably applied to the field of driving a microelectronic element like MOSFET. Based on Miller plateau voltage of the microelectronic element such as MOSFET, the power control device can dynamically adjust driving capability and set a driving voltage so as to control and balance turn-on loss and switch loss, and further achieve an optimal average efficiency, particularly, for selecting or replacing the microelectronic element like MOSFET. Also, an electronic system provided with the power control device effectively solves the problem of Electromagnetic Interference (EMI) imposed on peripheral devices.

10 Claims, 7 Drawing Sheets

POWER CONTROL DEVICE

BACKGROUND OF THE INVENTION

1. Field of the Invention

The present invention relates to a power control device, and more specifically to a power control device for dynamically adjusting the driving capability, setting a driving voltage, controlling and balancing turn-on loss and switch loss to achieve balance, and solving the problem of Electromagnetic Interference (EMI).

2. The Prior Arts

In a power electronic system provided with a power supply operating in a switch power mode, a metal oxide semiconductor field effect transistor (MOSFET) is often employed as a semiconductor switch element. It is crucial to attain high efficiency, low EMI, and a power MOSFET gate driver well controlled.

In Taiwan patent No. 1250406, a gate driven multiple chip module (MCM) is disclosed. The multiple chip module serves as a power circuit of a computer mother board, and has a small package size without reducing performance. The MCM is implemented by packaging all essential power circuit elements on a ball gate array (BGA) substrate. Two MOSFETs are placed on the BGA substrate, and construct a half bridge structure between the input voltage and the ground. The MOSFET gate driven device is electrically connected to the gates of two MOSFETs, respectively, to alternatively switch the power MOSFETs. Specifically, a common connection of the MOSFETS generates an AC output voltage.

Taiwan patent No. 1563788, "a circuit and power module for electronic device and a method of assembling a buck device", provides a circuit for supplying power to an electronic device. The circuit comprises a primary power circuit and a secondary power circuit. The primary power circuit receives an AC input power signal from a power supply, and generates a middle DC power signal. The middle DC power signal is generated by the first voltage level smaller than a voltage level of the AC input power signal. The secondary power circuit receives the middle DC power signal from the primary power circuit, and delivers an output DC power signal to an electronic device. The output DC power signal is transmitted at an output voltage level smaller than the first voltage level of the middle DC power signal.

In the patent of CN 103095137 B with a title "dynamic MOSFET gate driver", a system structure of dynamic MOSFET gate driver and a method of controlling the same are disclosed. A switch power converter comprises a transformer, a MOSFET switch, and a driver control circuit. The transformer comprises a primary winding coupled to an input voltage, and a secondary winding coupled to an output of the switch power converter. The MOSFET switch is coupled to the primary winding of the transformer. When the MOSFET switch is turned on, a current flowing through the primary winding is generated, and when the MOSFET switch is turned off, no current flowing through the primary winding is generated. The driver control circuit comprises a first MOSFET and a second MOSFET. The first MOSFET has a resistor with variable resistance. The second MOSFET also has a resistor with variable resistance, and is serially connected to the first MOSFET. The gate of the MOSFET switch is coupled to a connection of the first MOSFET and the second MOSFET. The driver control circuit is configured to generate a control signal, which is intended to turn on or off the MOSFET switch during switch cycles of the MOSFET switch. Each switch cycle comprises a first part for turning on the MOSFET switch, and a second part for turning off the MOSFET switch. The driver control circuit adjusts the turn-on resistance of the first MOSFET to change the value of the control signal from a first level within the first period in the first part of the switch cycle to a second level within the second period in the first part of the switch cycle. The second level is higher than the first level, and the first period is prior to the second period.

Another Taiwan patent No. 1473396 titled by "switch power converter and method of controlling the same" discloses a system structure and control method of a MOSFET gate driver. In a single switch cycle (one cycle), the MOSFET gate driver system dynamically adjusts the turn on resistance and the turn off resistance to reduce EMI resulting from the system, and particularly, minimizes turn-on loss within the operation of the MOSFET.

Furthermore, Taiwan patent No. 1399912 titled by "power converter and method of controlling the same" discloses a power converter using a microcontroller. In one embodiment, the power converter is implemented as a flyback or a forward converter. The microcontroller comprises a pulse width modulation (PWM) controller, an arithmetic logic unit (ALU), a random access memory (RAM), a read only memory (ROM), an analog-to-digital converter(s)(ADC/ADCs), and a digital-to-analog converter(s) (DAC/DACs). To implement a fast dynamic response in an internal current control loop, an analog comparator is used to provide a scheme of an analog current control. The analog comparator compares a signal indicating the current flowing into the power converter and a programmable reference voltage. The analog comparator can be integrated with the digital controller to form a single integrated circuit (IC). Further, through a USB port, the power converter may deliver various signal representing conditions like output voltage level, current level, error, and so on, or alternatively, receives a system control command like a command for output voltage level, current protection level, power saving mode for lowest power consumption, normal mode, power on, or power off.

However, from the above schemes in the prior arts, it is difficult for the current electronic system to implement the effect of the optimal average efficiency, easily replace the microelectronic element line MOSFET, and at the same time, solve the problem of EMI adversely affecting peripheral devices. After performing experiments and tests, the inventor provides a power control device, which demonstrates a feature of dynamically adjusting the driving ability based on Miller plateau voltage, setting the driving voltage, controlling turn on loss and switch loss for balance, and so on. Therefore, the power control device of the present invention can overcome the problems in the prior arts.

SUMMARY OF THE INVENTION

The primary objective of the present invention is to provide a power control device suitably applied to the field of driving a MOSFET. The present invention dynamically adjusts driving capability based on Miller plateau voltage of the MOSFET, and sets a driving voltage so as to control and balance turn-on loss and switch loss, further achieves an optimal average efficiency, and suppresses Electromagnetic Interference (EMI) of an electronic system provided with the power control device.

Another objective of the present invention is to provide a power control device applied to the field of driving a MOSFET. The power control device of the present invention has a function of dynamically adjusting the driving capability. As for an electronic system provided with the power control device, the driving voltage can be resiliently adjusted in a smart way according to characteristics of different MOS/MOSFET. For example, the driving voltage is increased, as the level of the Miller plateau voltage increases. Further, turn-on loss and switch loss is controlled to attain balance, an optimal average efficiency is achieved, and Electromagnetic Interference (EMI) is suppressed.

A yet objective of the present invention is to provide a power control device generating a driving condition for a MOSFET, particularly, not limited to a specific form. The power control device of the present invention implements a function of dynamically adjusting the driving capability, and is applied to the electronic system. The level of the driving voltage is adjusted according to the loading and the input voltage of the electronic system. Specifically, the driving voltage is lower as the loading is lower. For example, when the input voltage of the electronic system is AC 115Vac (or less than 180Vac), the driving voltage is 12V for ½ loading to full loading. The driving voltage is gradually decreased if the loading is less than ½. Finally, the driving voltage is 9V for no loading. In other words, the driving voltage varies as the loading changes, and the level of the driving voltage is lowered as the loading decreased. Additionally, when the input voltage of the electronic system is 230Vac (or greater than 180Vac), the driving voltage is 11V for full loading. The driving voltage is gradually decreased if the loading is less than 80%. Finally, the driving voltage is 8V for no loading.

According to the above objects, the power control device is provided by the present invention, and comprises a controller and a microelectronic element.

The controller is an integrated circuit or a system-on-chip, or the controller is part of the integrated circuit or the system-on-chip.

The microelectronic element is an active element, a passive element, or a combination of the active element and the passive element. The passive element is a resistor, capacitor, inductor, and diode, and the active element is a metal oxide semiconductor field effect transistor (MOSFET), complementary metal oxide semiconductor (CMOS) transistor, bipolar junction transistor (BJT), lateral diffused metal oxide semiconductor (LDMOS) transistor, High Power MOS Transistor, or other types of transistor.

The power control device of the present invention provides a function of dynamically adjusting the driving capability, and is applied to an electronic system. The driving voltage or the level of the driving voltage is resiliently adjusted in a smart way according to characteristics of different MOS/MOSFET. For example, as the level of the Miller plateau voltage is higher, the driving voltage is increased, turn-on loss and switch loss is controlled to attain balance, an optimal average efficiency is achieved, and the problem of EMI adversely affecting peripheral devices is solved.

In the electronic system provided with the power control device, the level of the driving voltage controlled by the controller is resiliently adjusted in a smart way based on characteristics of different microelectronic element like MOS/MOSFET. In addition, when the level of the Miller plateau voltage of the MOS is higher, the driving voltage is increased, turn-on loss and switch loss is controlled to attain balance, an optimal average efficiency is achieved, and the problem of EMI adversely affecting peripheral devices is solved.

As with one single electronic system provided with the power control device, and the driving current controlled by the controller and complying with the microelectronic element, the lower driving voltage has higher efficiency than the higher driving voltage for the same driving current. The effect is more obvious for lighter loading. Also, EMI radiation is improved.

Moreover, for the driving voltage controlled by the controller and complying with the microelectronic element at the same driving voltage, the effect of suppressing EMI is better if the driving current is slower at the beginning, and then faster, and the efficiency is higher if the driving current is faster at the beginning and then slower.

The efficiency is better for the lower driving voltage, and the effect is more obvious if the loading is lighter. Also, EMI radiation is improved.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
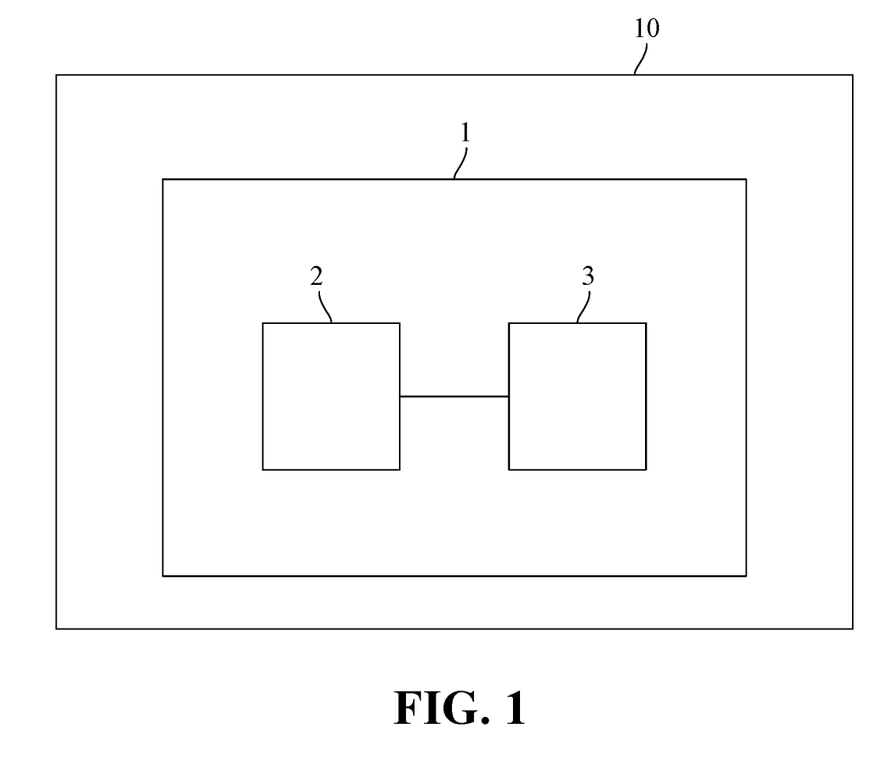
FIG. 1 is a view of the power control device according the present invention.

Please refer to FIG. 1, showing the power control device according the present invention. As shown in FIG. 1, the power control device 1 of the present invention generally comprises a controller 2, and a microelectronic element 3. The power control device 1 is provided in an electronic system 10 and complies with the operation of the electronic system 10.

The controller 2 is an integrated circuit or a system-on-chip, or the controller is part of the integrated circuit or the system-on-chip.

The microelectronic element 3 is an active element, a passive element, or a combination of the active element and the passive element. The passive element is a resistor, capacitor, inductor, and diode, and the active element is a metal oxide semiconductor field effect transistor (MOSFET), complementary metal oxide semiconductor (CMOS) transistor, bipolar junction transistor (BJT), lateral diffused metal oxide semiconductor (LDMOS) transistor, High Power MOS Transistor, or other types of transistor.

The power control device 1 of the present invention provides a function of dynamically adjusting the driving capability, and is applied to an electronic system 10. The driving voltage or the level of the driving voltage is resiliently adjusted in a smart way according to characteristics of different MOS/MOSFET. For example, as the level of the Miller plateau voltage is higher, the driving voltage is increased, turn-on loss and switch loss is controlled to attain balance, an optimal average efficiency is achieved, and the problem of EMI adversely affecting peripheral devices is solved.

The power control device 1 provides a function of dynamically adjusting the driving capability, and is applied to an electronic system 10. Based on the loading and the input voltage of the electronic system 10, the level of the driving voltage for the microelectronic element 3 is adjusted. The driving voltage is lower as the loading is lower. For example, when the input voltage of the electronic system 10 is AC 115Vac (or less than 180Vac), the driving voltage controlled by the controller 2 is 12V for ½ loading to full loading. The driving voltage is gradually decreased if the loading is less than ½. Finally, the driving voltage is 9V for no loading. In other words, the driving voltage varies as the loading changes, and the level of the driving voltage is lowered as the loading decreased. Additionally, when the input voltage of the electronic system 10 is 230Vac (or greater than 180Vac), the driving voltage is 11V for full loading. The driving voltage is gradually decreased if the loading is less than 80%. Finally, the driving voltage is 8V for no loading.

In the electronic system 10 provided with the power control device 1, the level of the driving voltage controlled by the controller 2 is resiliently adjusted in a smart way based on characteristics of different microelectronic element like MOS/MOSFET. For example, when the level of the Miller plateau voltage of the MOS is higher, the driving voltage is increased, turn-on loss and switch loss is controlled to attain balance, an optimal average efficiency is achieved, and the problem of EMI adversely affecting peripheral devices is solved.

As with one single electronic system 10 provided with the power control device 1, and the driving current controlled by the controller 2 and complying with the microelectronic element 3, the lower driving voltage has higher efficiency than the higher driving voltage for the same driving current. The effect is more obvious for lighter loading. Also, EMI radiation is improved.

Moreover, for the driving voltage controlled by the controller 2 and complying with the microelectronic element 3 at the same driving voltage, the effect of suppressing EMI is better if the driving current is slower at the beginning, and then faster, and the efficiency is higher if the driving current is faster at the beginning and then slower.

The efficiency is better for the lower driving voltage, and the effect is more obvious if the loading is lighter. Also, EMI radiation is improved.

Hereinafter, detailed correlation between the driving voltage of the microelectronic element and the average conversion efficiency at different alternative current (AC) input voltage for the electronic system is described.

If the microelectronic element 3 is a MOSFET element and the input voltage Vac for the electronic system 10 is 115V or 230V, the average conversion efficiency of the electronic system 10 is better as the driving voltage of the microelectronic element 3 (that is, MOSFET) gets lower. Specifically, the average conversion efficiency of the electronic system 10 is defined by output power/input power.

In addition, as for the microelectronic element 3 being a MOSFET element, if the input voltage Vac for the electronic system 10 is 115V or 230V and the electronic system 10 is at no loading, the power consumption of the electronic system 10 is improved as the driving voltage of the microelectronic element 3 gets lower. Moreover, if the driving voltage of the electronic system 10 is low, like Vac=115V, the power consumption of the electronic system 10 at no loading is low.

Further, for the microelectronic element 3 being a MOSFET element, owing to the low line effect for the different driving voltage adjusted by the controller 2 of the electronic system 10, like 1Vcc(9V), 12Vcc(12V), 16Vcc(16V), 24Vcc(24V), the electronic system 1 has different conversion efficiency for different output current of the power control device 1.

Figure 2:
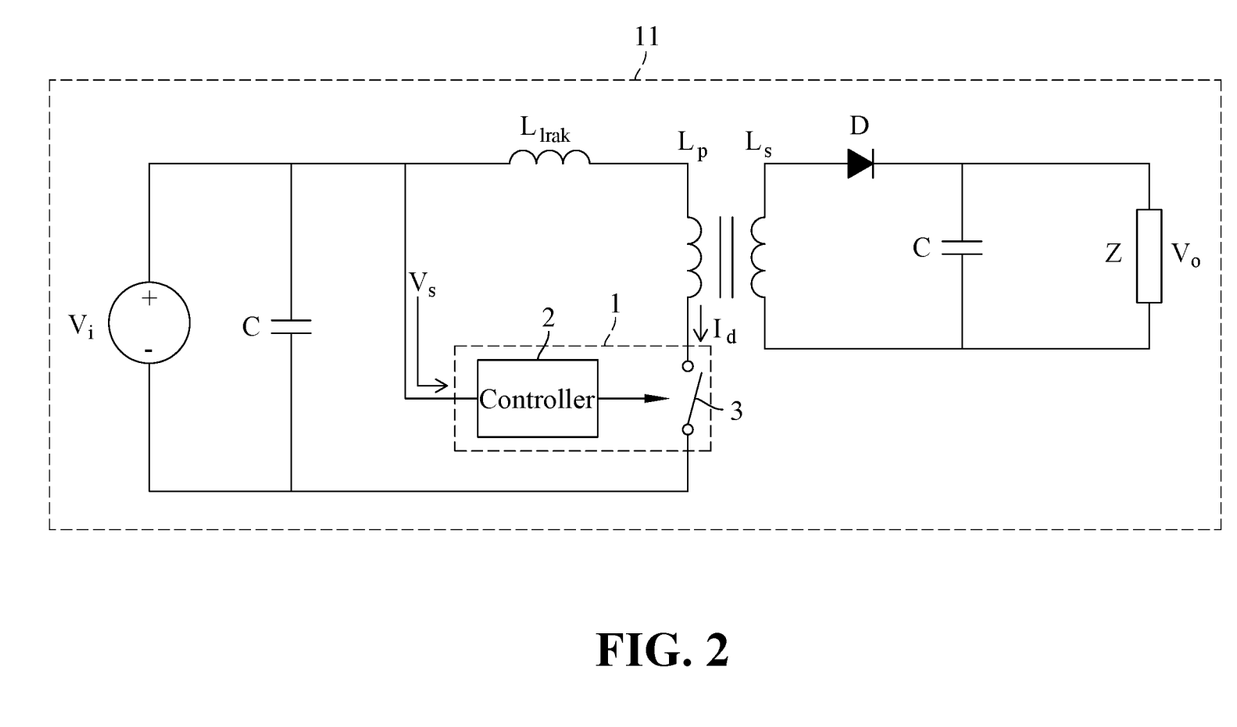
FIG. 2 is a view of the power control device according to one embodiment of the present invention.

FIG. 2 is a view of the power control device according to one embodiment of the present invention. As shown in FIG. 2, the power control device 1 comprises a controller 2 and a microelectronic element 3. The power control device 1 is provided in an electronic system 11 and complies with the operation of the electronic system 11.

The controller 2 is an integrated circuit or a system-on-chip, or the controller is part of the integrated circuit or the system-on-chip.

The microelectronic element 3 is an active element, a passive element, or a combination of the active element and the passive element. The passive element is a resistor, capacitor, inductor, and diode, and the active element is a metal oxide semiconductor field effect transistor (MOSFET), complementary metal oxide semiconductor (CMOS) transistor, bipolar junction transistor (BJT), lateral diffused metal oxide semiconductor (LDMOS) transistor, High Power MOS Transistor, or other types of transistor.

The power control device 1 has a function of dynamically adjusting the driving capability, and as for the electronic system 11 provided with the power control device 1, the level of the driving voltage controlled by the controller 2 is resiliently adjusted in a smart way based on characteristics of different microelectronic element like MOS/MOSFET. For example, when the level of the Miller plateau voltage of the MOS is higher, the driving voltage is increased, turn-on loss and switch loss is controlled to attain balance, an optimal average efficiency is achieved, and the problem of EMI adversely affecting peripheral devices is solved.

As shown in FIG. 2, the power control device 1 is provided in the electronic system 11. The electronic system 11 comprises a power transformer, comprising a leakage inductor Lleak, a primary winding Lp, and a secondary winding Ls. The secondary output stage comprises a diode D and an output capacitor C. The controller 2 of the power control device 1 employs a driving signal with turn-on time Ton and turn-off time Toff in a pulse form to control the turn-on and turn-off state of the microelectronic element 3 like MOSFET.

The input voltage Vi of the electronic system 11 is direct current (DC) voltage, and when the microelectronic element 3 (switch 3) is turned on, the input power is stored in the primary winding Lp of the transformer. This is because the diode D suffers reversed biased when the microelectronic element 3 (switch 3) is turned on. Then, when the microelectronic element 3 (switch 3) is turned off, the rectified power flows to the load Z through the capacitor C. This is because the diode D suffers positively biased when the microelectronic element 3 (switch 3) is turned off. The diode D serves as an output rectifier and the capacitor C serves as an output filter for the adjusted output voltage Vo delivered to the load Z.

The controller 2 generates an appropriate switch driving pulse to control the turn-on time and the turn-off time of the microelectronic element 3 (switch 3), and further regulates the output voltage Vo. The controller 2 in multiple operation mode including pulse width modulation (PWM) and/or pulse frequency modulation (PFM) uses a feedback loop to control the microelectronic element 3 (switch 3) based on the sensed output voltage Vs and the sensed primary side current Id in the previous switch cycle of the switch power converter.

The output voltage Vo across the primary winding Lp generates the voltage Vs input to the controller 2 through reflection. Based on the sensed output voltage, the controller 2 determines the operation frequency of the switch power converter, and the operation frequency specifies the frequency of the turn-on time and the turn-off time of the output driving signal.

Figure 3:
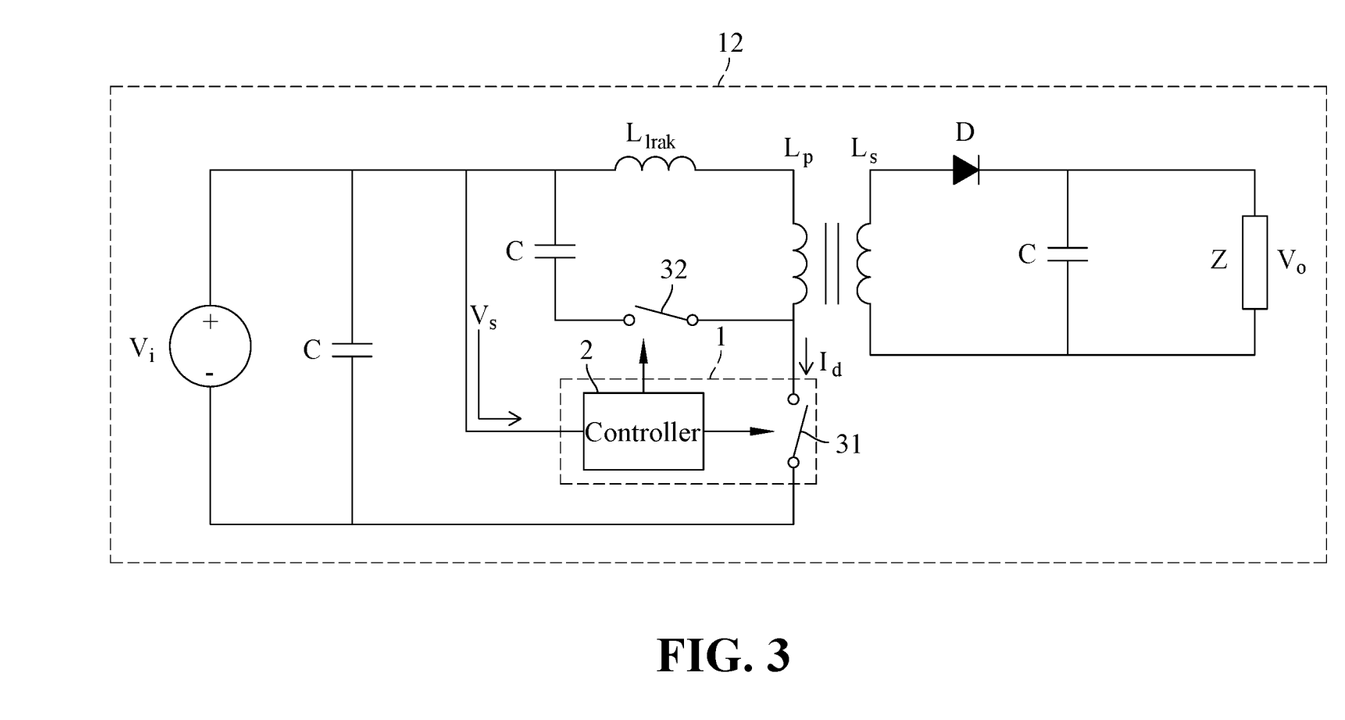
FIG. 3 is a view of the power control device according to another embodiment of the present invention.

FIG. 3 is a view of the power control device according to another embodiment of the present invention. As shown in FIG. 3, the power control device 1 comprises a controller 2 and a microelectronic element 3. The power control device 1 is provided in an electronic system 12 and complies with the operation of the electronic system 12.

The controller 2 is an integrated circuit or a system-on-chip, or the controller is part of the integrated circuit or the system-on-chip.

The microelectronic element 3 is an active element, a passive element, or a combination of the active element and the passive element. The passive element is a resistor, capacitor, inductor, and diode, and the active element is a metal oxide semiconductor field effect transistor (MOSFET), complementary metal oxide semiconductor (CMOS) transistor, bipolar junction transistor (BJT), lateral diffused metal oxide semiconductor (LDMOS) transistor, High Power MOS Transistor, or other types of transistor.

The power control device 1 has a function of dynamically adjusting the driving capability, and as for the electronic system 12 provided with the power control device 1, the level of the driving voltage controlled by the controller 2 is resiliently adjusted in a smart way based on characteristics of different microelectronic element like MOS/MOSFET. For example, when the level of the Miller plateau voltage of the MOS is higher, the driving voltage is increased, turn-on loss and switch loss is controlled to attain balance, an optimal average efficiency is achieved, and the problem of EMI adversely affecting peripheral devices is solved.

As shown in FIG. 3, the power control device 1 is provided in the electronic system 12. The electronic system 12 comprises a power transformer, comprising a leakage inductor Lleak, a primary winding Lp, and a secondary winding Ls. The secondary output stage comprises a diode D and an output capacitor C. The controller 2 of the power control device 1 employs a driving signal with turn-on time Ton and turn-off time Toff in a pulse form to control the turn-on and turn-off state of the microelectronic element 3 comprising two MOSFET, that is, the first switch 31 and the second switch 32.

The input voltage Vi of the electronic system 12 is DC voltage. When the MOSFETs (the first switch 31 and the second switch 32) of the microelectronic element 3 is turned on, the input power is stored in the primary winding Lp of the transformer. This is because the diode D suffers reversed biased when the microelectronic element 3 (the first switch 31 and the second switch 32) is turned on. Then, when the microelectronic element 3 (the first switch 31 and the second switch 32) is turned off, the rectified power flows to the load Z through the capacitor C. This is because the diode D suffers positively biased when the microelectronic element 3 (the first switch 31 and the second switch 32) is turned off. The diode D serves as an output rectifier and the capacitor C serves as an output filter for the adjusted output voltage Vo delivered to the load Z.

The controller 2 generates an appropriate switch driving pulse to control the turn-on time and the turn-off time of the microelectronic element 3 (the first switch 31 and the second switch 32), and further regulates the output voltage Vo. The controller 2 in multiple operation mode including PWM and/or PFM uses a feedback loop to control the microelectronic element 3 (the first switch 31 and the second switch 32) based on the sensed output voltage Vs and the sensed primary side current Id in the previous switch cycle of the switch power converter.

The output voltage Vo across the primary winding Lp generates the voltage Vs input to the controller 2 through reflection. Based on the sensed output voltage, the controller 2 determines the operation frequency of the switch power converter, and the operation frequency specifies the frequency of the turn-on time and the turn-off time of the output driving signal.

Figure 4A:
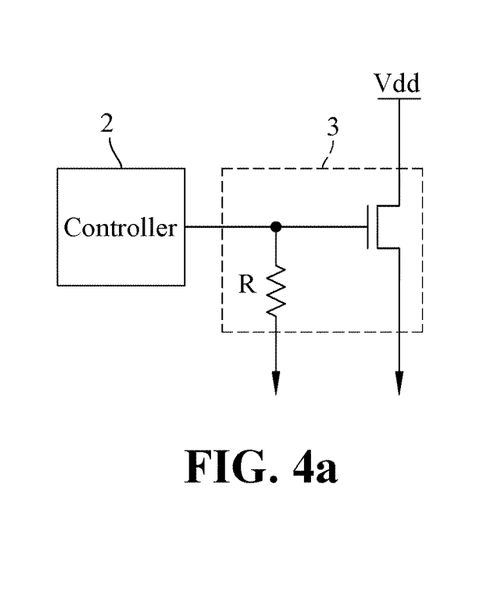
FIG. 4*a* is a view of the power control device according to one embodiment of the present invention.

FIG. 4a is a view of the power control device according to one embodiment of the present invention. As shown in FIG. 4a, the power control device 1 comprises a controller 2 and a microelectronic element 3.

The controller 2 is an integrated circuit or a system-on-chip, or the controller is part of the integrated circuit or the system-on-chip.

The microelectronic element 3 is an active microelectronic element, a passive microelectronic element, or a combination of the active microelectronic element and the passive microelectronic element. Specifically, the microelectronic element 3 comprises MOS and resistor R, and the output port of the controller 2 is connected to the gate of MOS and one end of the resistor R.

Figure 4B:
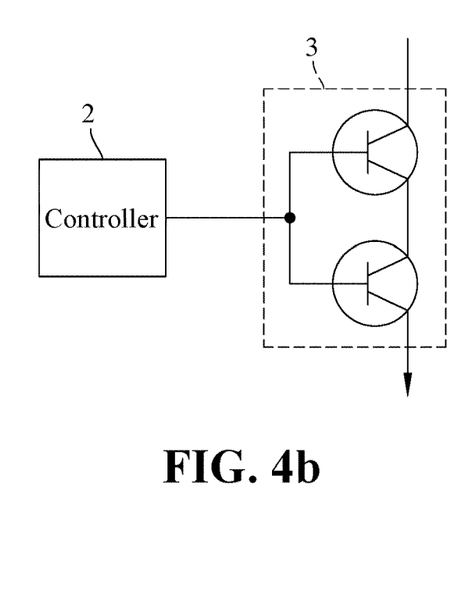
FIG. 4*b* is a view of the power control device according to one embodiment of the present invention.

FIG. 4b is a view of the power control device according to one embodiment of the present invention. As shown in FIG. 4b, the power control device 1 comprises a controller 2 and a microelectronic element 3.

The controller 2 is an integrated circuit or a system-on-chip, or the controller is part of the integrated circuit or the system-on-chip.

The microelectronic element 3 is an active microelectronic element, a passive microelectronic element, or a combination of the active microelectronic element and the passive microelectronic element. Specifically, the microelectronic element 3 comprises an NPN transistor and a PNP transistor.

Figure 4C:
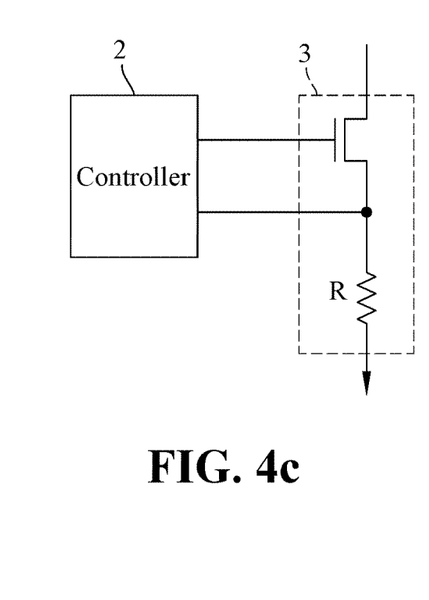
FIG. 4*c* is a view of the power control device according to one embodiment of the present invention.

FIG. 4c is a view of the power control device according to one embodiment of the present invention. As shown in FIG. 4c, the power control device 1 comprises a controller 2 and a microelectronic element 3.

The controller 2 is an integrated circuit or a system-on-chip, or the controller is part of the integrated circuit or the system-on-chip.

The microelectronic element 3 is an active microelectronic element, a passive microelectronic element, or a combination of the active microelectronic element and the passive microelectronic element. Specifically, the microelectronic element 3 comprises MOS and resistor R, and the output port of the controller 2 is connected to the gate of MOS and one end of the resistor R.

Figure 5:
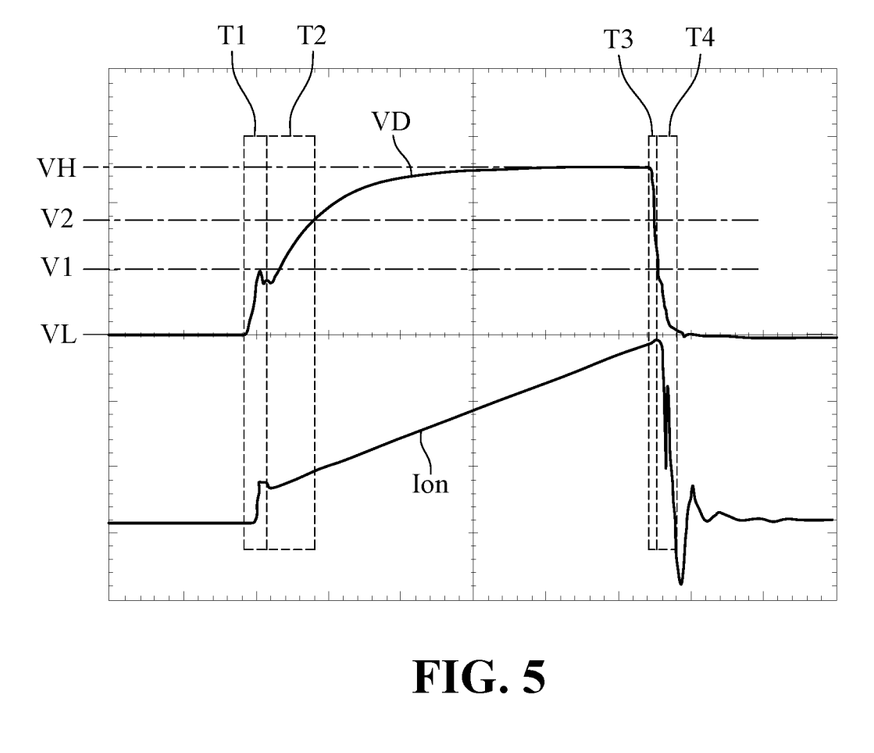
FIG. 5 is a waveform of the driving voltage and the driving current controlled by the controller according to the present invention.

FIG. 5 is a waveform of the driving voltage and the driving current Ion controlled by the controller of the power control device according to the present invention.

As shown in FIG. 5, the microelectronic element 3 is a MOSFET as an example. T1 is the first rising time for the driving voltage V and the driving current Ion, T2 is the second rising time, T3 is the first falling time, and T4 is the second falling time.

Within the first rising time T1, the driving voltage V rises to the first voltage level V1 from the level VL, and the driving current Ion starts to rise. During the period of the first rising time T1, the gate-to-source voltage VGS of the microelectronic element 3 rises to the first voltage level V1 higher than the threshold voltage VTH of the microelectronic element 3, and the microelectronic element 3 starts to turn on. During this period, the drain-to-source voltage VDS of the microelectronic element 3 keeps at a high voltage.

Within the second rising time T2, the driving voltage V rises to a voltage V2, and the driving current Ion keeps rising. During the period of the second rising time T2, the drain-to-source voltage VDS of the microelectronic element 3 falls down to a low level, and the gate-to-source voltage VGS of the microelectronic element 3 continuously rises, and further, between the second rising time T2 and the first falling time T3, the gate-to-source voltage VGS rises up and approaches the highest voltage VH (Vcc).

That is, the driving voltage V rises to the highest voltage VH and the driving current Ion keeps rising between the second rising time T2 and the first falling time T3.

Within the first falling time T3, the driving voltage V starts to fall from the highest voltage VH down to a low voltage V2, and the driving current Ion falls down. During the period of the first falling time T3, the gate-to-source voltage VGS of the microelectronic element 3 falls from the voltage Vcc down to a voltage V2 higher than the threshold voltage VTH, and the drain-to-source voltage VDS of the microelectronic element 3 keeps at a low level.

Within the second falling time T4, the driving voltage V falls from the voltage V2 down to the voltage V1, and further down to the voltage VL, and the driving current Ion falls down. Specifically, during the period of the second falling time T4, the drain-to-source voltage VDS of the microelectronic element 3 firstly attains to the highest voltage, and then falls down, and the gate-to-source voltage VGS of the microelectronic element 3 falls down to zero. Once the gate-to-source voltage VGS falls down to a value lower than the threshold voltage VTH, the microelectronic element 3 turns off.

Figure 6:
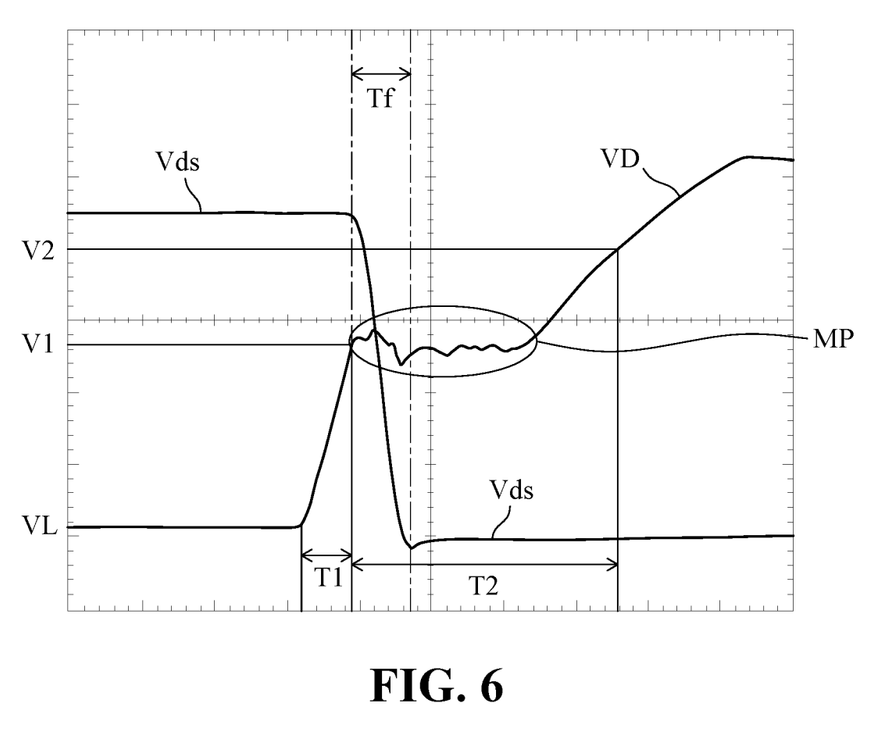
FIG. 6 is a waveform of the driving voltage controlled by the controller for the operation of turning on according to the present invention.

FIG. 6 is a waveform of the driving voltage controlled by the controller for the operation of turning on according to the present invention.

Here, the microelectronic element 3 is a MOSFET. Within the first rising time T1, the driving voltage V rises to the first voltage level V1 from the level VL, the gate-to-source voltage VGS of the microelectronic element 3 rises to the first voltage level V1 higher than the threshold voltage VTH of the microelectronic element 3 to cause the microelectronic element 3 to turn on, and the drain-to-source voltage VDS of the microelectronic element 3 keeps at the high voltage.

Within the second rising time T2, the driving voltage V rises to the voltage V2, the drain-to-source voltage VDS of the microelectronic element 3 falls down to the low level, and the gate-to-source voltage VGS rises and further approaches the highest voltage VH (Vcc).

Figure 7:
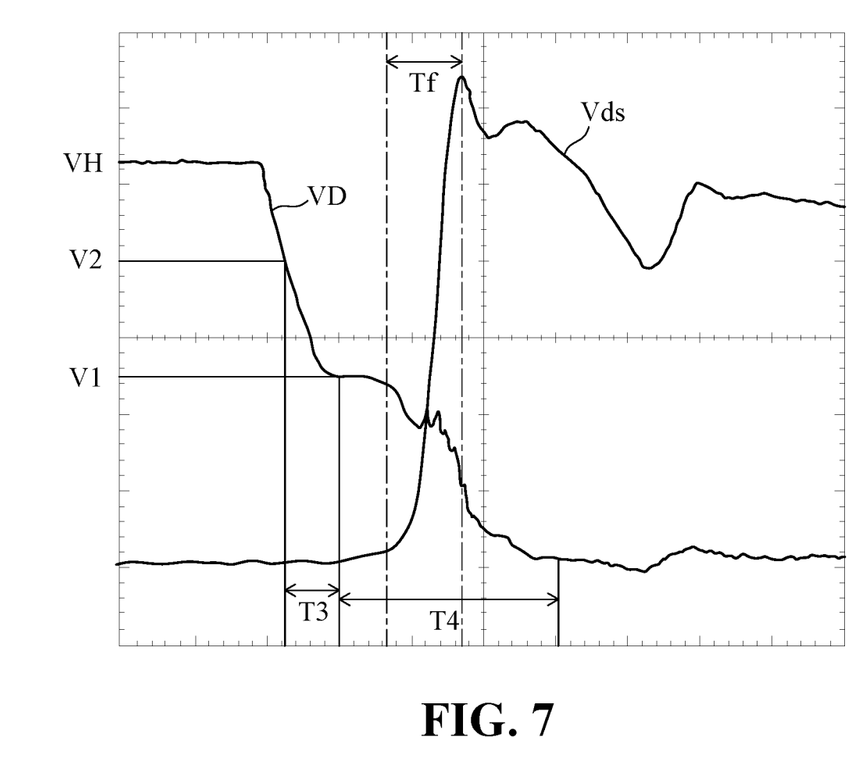
FIG. 7 is a waveform of the driving voltage controlled by the controller for the operation of turning off according to the present invention.

FIG. 7 is a waveform of the driving voltage controlled by the controller for the operation of turning off according to the present invention.

Here, the microelectronic element 3 is a MOSFET. Within the first falling time T3, the driving voltage V falls from the highest voltage VH down to a low voltage V2, and the driving current Ion falls down. Further, the gate-to-source voltage VGS of the microelectronic element 3 falls from the voltage Vcc down to the voltage V2 higher than the threshold voltage VTH, and the drain-to-source voltage VDS of the microelectronic element 3 keeps at the low level.

Within the second falling time T4, the driving voltage V falls from the voltage V2 down to the voltage V1, and further down to the voltage VL, and the driving current Ion falls down. Further, the drain-to-source voltage VDS of the microelectronic element 3 firstly attains to the highest voltage, then falls down, and finally approaches zero. Once the gate-to-source voltage VGS falls down and is lower than the threshold voltage VTH, the microelectronic element 3 turns off.

From the above description about the embodiments, the present invention provides the power control device applied to the environment for driving the MOSFET. Specifically, the power control device of the present invention possesses the feature of dynamically adjusting the driving ability by setting the driving voltage based on the Miller plateau voltage of the MOSFET, controlling turn-on loss and switch loss to keep balance, and achieving the optimal average efficiency. Thus, it is easy to replace and change the MOSFET, and at the same time, the problem of EMI caused by the electronic system provided with the power control device and adversely affecting peripheral devices is solved.

In summary, the power control device of the present invention demonstrates the following aspects.

The power control device of the present invention dynamically adjusts the driving ability by setting the driving voltage based on the Miller plateau voltage of the MOSFET, controlling turn-on loss and switch loss to keep balance, achieving the optimal average efficiency, easily replacing the MOSFET, and at the same time, solving the problem of EMI caused by the electronic system provided with the power control device and adversely affecting peripheral devices.

As for the electronic system provided with the power control device of the present invention, the level of the driving voltage is resiliently adjusted in a smart way. Specifically, the driving level is adjusted according to characteristics of the MOS/MOSFET. For example, as the Miller plateau voltage increases, the driving level is adjusted higher to control turn-on loss and switch loss for balance, achieve the optimal average efficiency, and at the same time, solve the problem of EMI adversely affecting peripheral devices.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A power control device for dynamically adjusting a driving capability, comprising:

a controller, the controller receiving a sensed output voltage derived from an output voltage of a switch power converter; and a microelectronic element connected to the controller, the microelectronic element having a turn-on state and a turn-off state for controlling an operation frequency of the switch power converter;

wherein the controller determines the operation frequency of the switch power converter based on the sensed output voltage, sets a driving voltage for the microelectronic element, controls and balances turn-on loss and switch loss of the microelectronic element, and attains an optimal average efficiency, the driving voltage having a turn-on time and a turn-off time specified by the operation frequency.

2. The power control device as claimed in claim 1, wherein the power control device is provided in an electronic system to comply with an operation of the electronic system.

3. The power control device as claimed in claim 1, wherein the controller is an integrated circuit or a system-on-chip, or the controller is part of the integrated circuit or the system-on-chip.

4. The power control device as claimed in claim 1, wherein the microelectronic element is an active element, a passive element, or a combination of the active element and the passive element.

5. The power control device as claimed in claim 4, wherein the passive element is selected from a group consisting of at least one of a resistor, capacitor, inductor, and diode, and the active element is selected from a group consisting of at least one of a metal oxide semiconductor field effect transistor (MOSFET), complementary metal oxide semiconductor (CMOS) transistor, bipolar junction transistor (BJT), lateral diffused metal oxide semiconductor (LDMOS) transistor, and High Power MOS Transistor.

6. A power control device for dynamically adjusting a driving capability, comprising:

a controller, the controller receiving a sensed output voltage derived from an output voltage of a switch power converter; and a microelectronic element connected to the controller, setting a driving voltage for the microelectronic element, and adjusting a level of the driving voltage based on characteristics of the microelectronic element, the microelectronic element having a turn-on state and a turn-off state for controlling an operation frequency of the switch power converter;

wherein the controller determines the operation frequency of the switch power converter based on the sensed output voltage, increases the level of the driving voltage as Miller plateau voltage of the microelectronic element increases, controls turn-on loss and switch loss to attain balance, achieves an optimal average efficiency, and suppresses Electromagnetic Interference (EMI), the driving voltage having a turn-on time and a turn-off time specified by the operation frequency.

7. The power control device as claimed in claim 6, wherein the power control device is provided in an electronic system to comply with an operation of the electronic system.

8. The power control device as claimed in claim 6, wherein the controller is an integrated circuit or a system-on-chip, or the controller is part of the integrated circuit or the system-on-chip.

9. The power control device as claimed in claim 6, wherein the microelectronic element is an active element, a passive element, or a combination of the active element and the passive element.

10. The power control device as claimed in claim 9, wherein the passive element is selected from a group consisting of at least one of a resistor, capacitor, inductor, and diode, and the active element is selected from a group consisting of at least one of a metal oxide semiconductor field effect transistor (MOSFET), complementary metal oxide semiconductor (CMOS) transistor, bipolar junction transistor (BJT), lateral diffused metal oxide semiconductor (LDMOS) transistor, and High Power MOS Transistor.

* * * * *